United States Patent
Hsu et al.

(10) Patent No.: US 8,436,801 B2
(45) Date of Patent: May 7, 2013

(54) LEVEL SHIFT CIRCUIT, LIQUID CRYSTAL DISPLAY DEVICE AND CHARGE SHARING METHOD

(75) Inventors: Chao-Ching Hsu, Hsin-Chu (TW); Mu-Lin Tung, Hsin-Chu (TW); Chung-Shen Cheng, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 491 days.

(21) Appl. No.: 12/684,908

(22) Filed: Jan. 9, 2010

(65) Prior Publication Data

US 2011/0169723 A1 Jul. 14, 2011

(30) Foreign Application Priority Data

May 20, 2009 (TW) ................................ 98116777 A

(51) Int. Cl.
G09G 3/36 (2006.01)
(52) U.S. Cl.
USPC ................ 345/100; 345/204; 345/30; 345/50
(58) Field of Classification Search .......... 345/204–215, 345/30, 38, 50, 55, 100–104
See application file for complete search history.

(56) References Cited

U.S. PATENT DOCUMENTS

| 5,574,633 | A | 11/1996 | Prater |
| 6,573,881 | B1 | 6/2003 | Kwon |
| 7,403,185 | B2 * | 7/2008 | Song et al. ..................... 345/100 |
| 2008/0122829 | A1 * | 5/2008 | Park ............................. 345/213 |
| 2008/0278467 | A1 * | 11/2008 | Hwang et al. ................. 345/205 |

* cited by examiner

Primary Examiner — Christopher E Leiby
(74) Attorney, Agent, or Firm — WPAT, PC; Justin King

(57) ABSTRACT

A level shift circuit includes a control logic circuit, a plurality of level shift output buffers and a plurality of charge sharing circuits. The control logic circuit receives input clock pulse signals and a charge sharing signal and acquires voltage level information of each received signal. Each output buffer amplifies a corresponding input clock pulse signal and determines whether to output a signal according to the acquired information of the charge sharing signal. Each charge sharing circuit determines whether to be turned on according to the acquired information of a corresponding input clock pulse signal. When a charge sharing circuit is turned on, the output terminal of a corresponding output buffer and a predetermined voltage level are coupled to each other by the charge sharing circuit, so as to perform the charge sharing operation. Furthermore, a corresponding liquid crystal display device and a corresponding charge sharing method are also provided.

20 Claims, 6 Drawing Sheets

LEVEL SHIFT CIRCUIT, LIQUID CRYSTAL DISPLAY DEVICE AND CHARGE SHARING METHOD

CROSS-REFERENCE TO RELATED APPLICATIONS

This application is based upon and claims the benefit of priority from the prior Taiwanese Patent Application No. 098116777, filed May 20, 2009, the entire contents of which are incorporated herein by reference.

BACKGROUND

1. Field of the Invention

The present invention relates to the field of display technology and, more particularly, to a level shift circuit, a liquid crystal display device and a charge sharing method.

2. Description of Related Art

Because of advantages such as light weight, thin thickness, low radiation, etc., the liquid crystal display device has gradually replaced the CRT display device (i.e., the cathode ray tube display device) and becomes a main stream of fabricating the PC monitor (i.e., the display of the computer) and the TV set (i.e., the television set). The liquid crystal display device typically comprises a display panel, a circuit board, a gate driving circuit and a source driving circuit, wherein the gate driving circuit and the source driving circuit are disposed on the display panel. In addition, a timing controller is disposed on the circuit board and is configured for providing a plurality of control signals to the gate driving circuit and the source driving circuit. The gate driving circuit is configured for driving a plurality of gate lines on the display panel, and the source driving circuit is configured for outputting image signal to a plurality of data lines which are across the gate lines on the display panel. The gate driving circuit and the source driving circuit can be disposed on the display panel in a TCP form (i.e., tape carrier packaging form) or a COG form (i.e., chip on glass form). Furthermore, the gate driving circuit can be directly formed in the display panel, and this is so called GOA circuit (i.e., gate-on-array circuit). The structure which directly forms the gate driving circuit in the display panel comprises the shift register. The shift register comprises a plurality of stages which are connected in cascade, and the stages are configured for generating a plurality of gate driving pulses to drive the gate lines formed on the display panel sequentially.

In the current designs of the two phase GOA, the level shift circuit is disposed on the circuit board, so as to generate two clock pulse signals to sever as the clock pulse signals of the odd stage and the even stage respectively and to provide the energy needed by the gate driving pulses. Since the voltage amplitudes of the clock pulse signals (i.e., the voltage difference between the high level and the low level) are larger and more stages are coupled to the clock pulse signals, the parasitic capacitance is quite large. Keeping on charging and discharging the capacitance will result in power consumption, so that the charge sharing is needed to reduce the power consumption of the level shift circuit. Generally speaking, the polarities of the clock pulse signals are reverse. In current charge sharing methods, the clock pulse signals are coupled to each other to share charge to be pulled to a center voltage before the clock pulse signals change the polarities thereof. After that, the clock pulse signals are amplified to a target voltage by the output buffers of the level shift circuit respectively. Basically, the level shift circuit is just a simple amplifier and is incapable of performing the charge sharing function. Since the polarities of the clock pulse signals are reverse, one of the clock pulse signals should be pulled to low when the other one is pulled to high. That is, the clock pulse signals can not be pulled to the low level or the high level at the same time, resulting in the lack of the design flexibility of the waveforms.

On the other hand, for the designs of other multi-phase GOA (e.g. 4 phase GOA) and according to the current requirements of the waveforms, at least some of the time periods of the utilized multi-phase clock pulse signals situating in a high level overlap, so that the charge sharing can not be performed as the way adopted by the above-mentioned 2 phase clock pulses. This results in more power consumption. Furthermore, since the charge sharing can not be performed and the waveforms of the clock pulse signals are square waves, the feed-through effect is more serious, and this will affect the display quality of the display device.

BRIEF SUMMARY

The present invention relates to a level shift circuit, which has a charge sharing function to reduce the power consumption.

The present invention further relates to a liquid crystal display device, which adopts the level shift circuit with the charge sharing function to save power.

The present invention further relates to a charge sharing method, which is suitable for a variety of designs of multi-phase GOA circuits.

The present invention provides a level shift circuit. The level shift circuit is suitable for receiving a plurality of input clock pulse signals and a charge sharing signal and for performing a charge sharing operation on each of the input clock pulse signals to generate a plurality of output clock pulse signals. The level shift circuit comprises a control logic circuit, a plurality of level shift output buffers and a plurality of charge sharing circuits. The control logic circuit is configured for receiving the input clock pulse signals and the charge sharing signal and for acquiring voltage level information of each of the input clock pulse signals and voltage level information of the charge sharing signal. Each of the level shift output buffers has an input terminal and an output terminal, and the input terminals of the level shift output buffers are electrically coupled to the control logic circuit. Each of the level shift output buffers is configured for amplifying a corresponding one of the input clock pulse signals and determining whether to output the output clock pulse signal according to the voltage level information of the charge sharing signal acquired by the control logic circuit. Each of the charge sharing circuits is electrically coupled between a predetermined voltage level and the output terminal of a corresponding one of the level shift output buffers, and each of the charge sharing circuits determines whether to be turned on according to the voltage level information of a corresponding one of the input clock pulse signals acquired by the control logic circuit. When a charge sharing circuit is turned on, the predetermined voltage level and the output terminal of the corresponding one of the level shift output buffers are electrically coupled to each other to perform the charge sharing operation.

In one embodiment of the present invention, each of the charge sharing circuits comprises a first terminal and a second terminal. In addition, each of the first terminals of the charge sharing circuits is electrically coupled to the output terminal of a corresponding one of the level shift output buffers, and the second terminals of the charge sharing circuits are electrically coupled to a capacitor. The predetermined voltage level is the voltage across the capacitor.

In one embodiment of the present invention, the mentioned level shift circuit is suitable for a liquid crystal display device having a multi-phase gate-on-array shift register. The predetermined voltage level is a ground potential or a supply potential of the liquid crystal display device.

The present invention further provides a liquid crystal display device. The liquid crystal display device comprises a timing controller, a level shift circuit mentioned above and a multi-phase gate-on-array shift register. The timing controller is configured for generating a plurality of first clock pulse signals and a charge sharing signal. The level shift circuit is configured for receiving the first clock pulse signals and the charge sharing signal and for performing a charge sharing operation on each of the first clock pulse signals to generate a plurality of second clock pulse signals corresponding to the first clock pulse signals. The multi-phase gate-on-array shift register is configured for receiving the second clock pulse signals and for generating a plurality of gate driving pulses according to the second clock pulse signals to enable a plurality of gate lines of the liquid crystal display device.

The present invention further provides a charge sharing method. The method comprises: providing a plurality of input clock pulse signals and a charge sharing signal; and performing a charge sharing operation between each of the input clock pulse signals and an external power source according to voltage level information of the input clock pulse signals and voltage level information of the charge sharing signal, so as to generate a plurality of output clock pulse signals corresponding to the input clock pulse signals.

In one embodiment of the present invention, the charge sharing method mentioned above is suitable for being executed in the level shift circuit, and performing the charge sharing operation on each of the input clock pulse signals according to voltage level information of the input clock pulse signals and voltage level information of the charge sharing signal comprises: performing a first charge sharing operation when the input clock pulse signal changes form a first voltage level to a second voltage level; stopping performing the first charge sharing operation when the charge sharing signal changes from a third voltage level to a fourth voltage level, and determining the level shift circuit to start outputting a voltage level formed by amplifying the second voltage level by the level shift circuit; determining the level shift circuit to stop outputting the voltage level formed by amplifying the second voltage level by the level shift circuit when the input clock pulse signal changes from the second voltage level to the first voltage level, and performing a second charge sharing operation at the same time; and stopping performing the second charge sharing operation when the charge sharing signal charges from the fourth voltage level to the third voltage level, and determining the level shift circuit to start to output another voltage level formed by amplifying the first voltage level by the level shift circuit.

In one embodiment of the present invention, the first voltage level is lower than the second voltage level, and the third voltage level is lower than the fourth voltage level.

In one embodiment of the present invention, the time lengths of performing the first charge sharing operation and the second charge sharing operation are designed according to the pulse timing and/or the pulse width of the charge sharing signal.

In one embodiment of the present invention, the time periods of the output clock pulse signals situating in a high level do not overlap.

In one embodiment of the present invention, at least some of the time periods of the output clock pulse signals situate in a high level overlap.

In one embodiment of the present invention, the charge sharing method mentioned above further comprises providing a capacitor to sever as the external power source.

In one embodiment of the present invention, the charge sharing method mentioned above further comprises providing a fixed power source to sever as the external power source.

The present invention further provides a charge sharing method. The method comprises: providing a plurality of input clock pulse signals and a charge sharing signal; and performing a charge sharing operation on each of the input clock pulse signals to generate a plurality of output clock pulse signals corresponding to the input clock pulse signals. Wherein in performing the charge sharing operation on each of the input clock pulse signals, a first time period starting from the time where the input clock pulse signal changes from a first voltage level to a second voltage level to the time where the nearest charge sharing signal changes from a third voltage level to a fourth voltage level and a second time period starting from the time where the input clock pulse signal changes from the second voltage level to the first voltage level to the time where the nearest charge sharing signal changes from the fourth voltage level to the third voltage level are both the performing periods of the charge sharing operation.

In the embodiments of the present invention, the level shift circuit is designed according to particular circuit designs, such as adding a control logic circuit and a charge sharing circuit in the level shift circuit, and a predetermined voltage level used for performing the charge sharing operation with the input clock pulse signals is provided to the level shift circuit, so that the level shift circuit can process the charge sharing function to reduce the power consumption, and the liquid crystal display adopting the said level shift circuit can save power easily. On the other hand, a charge sharing signal (may be provided by the timing controller) is added to control the charge sharing operation of each input clock pulse signal, this overcomes the drawback that the waveforms of the clock pulse signals of the prior arts can not be designed flexibly. In addition, this enables the charge sharing methods provided by the embodiments of the present invention can be applied to a variety of designs of multi-phase GOA circuits, such as two phase, four phase or other multi-phase GOA circuits, and the time length of performing the charge sharing can be designed according to a variety of real requirements.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
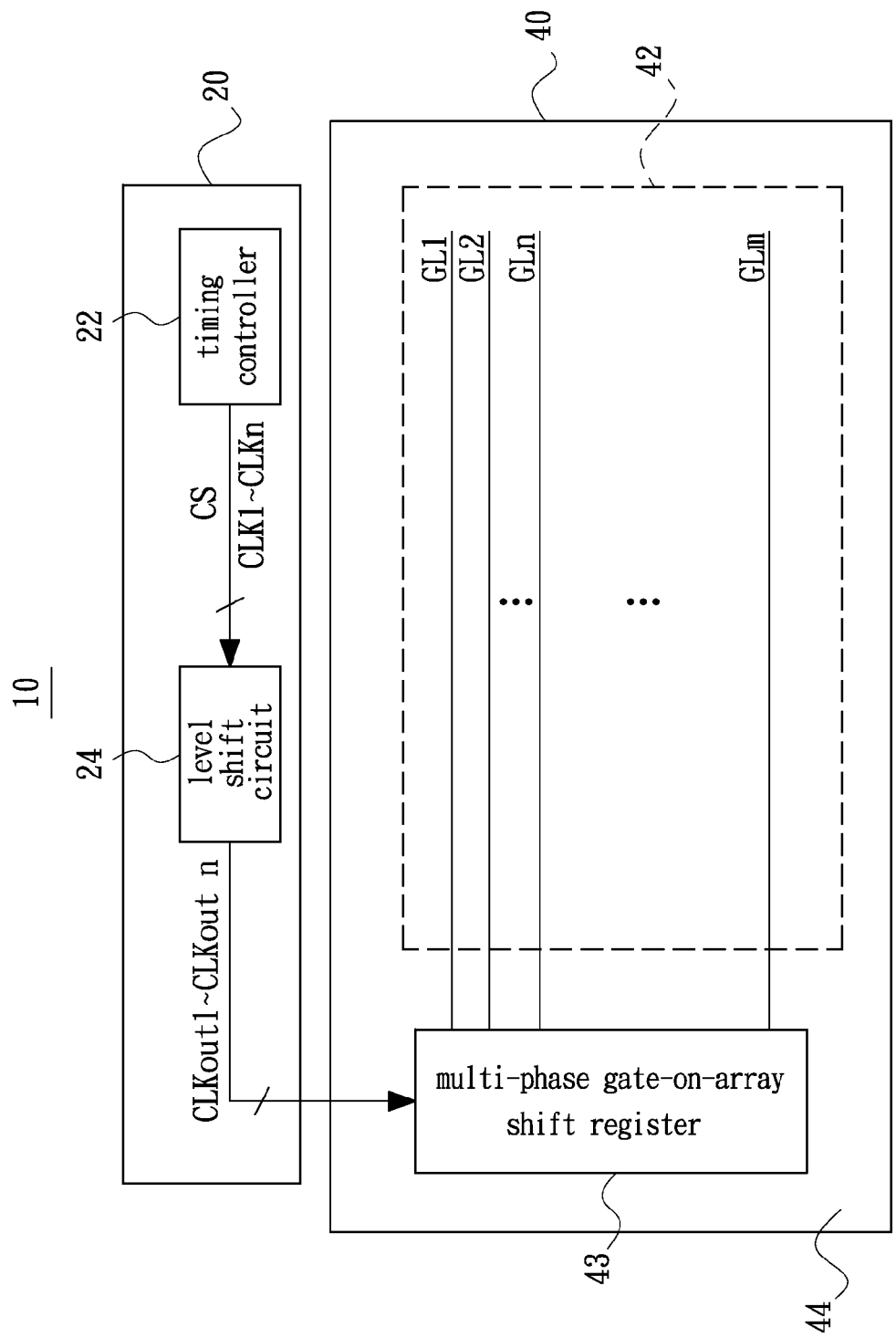
FIG. 1 shows a liquid crystal display device according to an embodiment of the present invention.

Referring to FIG. 1, a liquid crystal display device according to an embodiment of the present invention is shown. As shown in FIG. 1, the liquid crystal display device 10 comprises a circuit board 20 and a display panel 40. A timing controller 22 and a level shift circuit 24 are disposed on the circuit board 20. A display area 42 of the display pane 140 has a plurality of gate lines GL1~GLm, and a peripheral area 44 of the display panel 40 has a multi-phase gate-on-array shift register 43. Wherein the timing controller 22 is configured for generating a plurality of input clock pulse signals CLK1~CLKn and a charge sharing signal CS. The level shift circuit 24 is configured for receiving the input clock pulse signals CLK1~CLKn and the charge sharing signal CS and for performing a charge sharing operation on each of the input clock pulse signals CLK1~CLKn to generate a plurality of output clock pulse signals $CLK_{out1}$~$CLK_{outn}$ corresponding to the input clock pulse signals CLK1~CLKn respectively. The multi-phase gate-on-array shift register 43 is configured for receiving the output clock pulse signals $CLK_{out1}$~$CLK_{outn}$ and for generating a plurality of gate driving pulses according to the output clock pulse signals $CLK_{out1}$~$CLK_{outn}$ to drive the gate lines GL1~GLm of the liquid crystal display device 10 sequentially.

Figure 2:
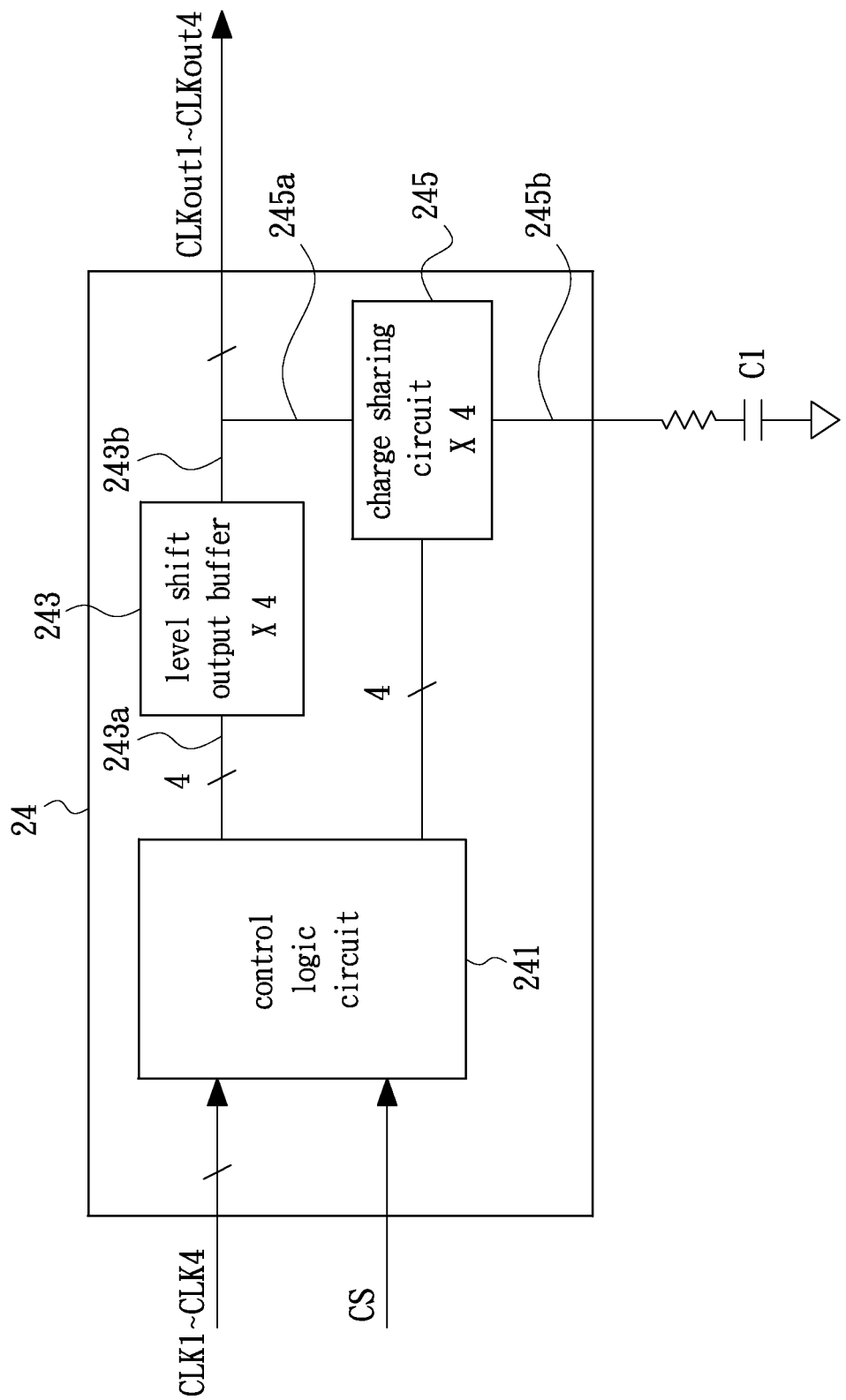
FIG. 2 shows a level shift circuit according to an embodiment of the present invention.

Referring to FIG. 2, a level shift circuit according to an embodiment of the present invention is shown. The level shift circuit 24 comprises a control logic circuit 241, a plurality of level shift output buffers 243 (e.g., four level shift output buffers) and a plurality of charge sharing circuits 245 (e.g., four charge sharing circuits). The control logic circuit 241 receives the input clock pulse signals CLK1~CLK4 (assuming that the n in the FIG. 1 is equal to four) and the charge sharing signal CS and acquires voltage level information of each of the input clock pulse signals CLK1~CLK4 and voltage level information of the charge sharing signal CS. Each of the level shift output buffers 243 comprises an input terminal 243a and an output terminal 243b, and the input terminals 243a of the level shift output buffers 243 are electrically coupled to the control logic circuit 241. Each of the level shift output buffers 243 is configured for amplifying a corresponding one of the input clock pulse signals CLK1~CLK4 and determining whether to output the output clock pulse signal according to the voltage level information of the charge sharing signal CS acquired by the control logic circuit 241. Each of the charge sharing circuit 245 comprises a first terminal 245a and a second terminal 245b. In addition, each of the first terminals 245a of the charge sharing circuits 245 is electrically coupled to a correspond one of the level shift output buffers 243, and the second terminals 245b of the charge sharing circuits 245 are coupled to a ground capacitor C1 via a resistor. The voltage level provided by the capacitor C1 is served as an external power source of the level shift circuit 24. Each of the charge sharing circuits 245 determines whether to be turned on according to the voltage level information of a corresponding one of the input clock pulse signals CLK1~CLK4 acquired by the control logic circuit 241. When a charge sharing circuit is turned on, the voltage level provided by the capacitor C1 and the output terminal 243a of a corresponding one of the level shift output buffers 243 are electrically coupled to each other to perform the charge sharing operation.

Figure 3:
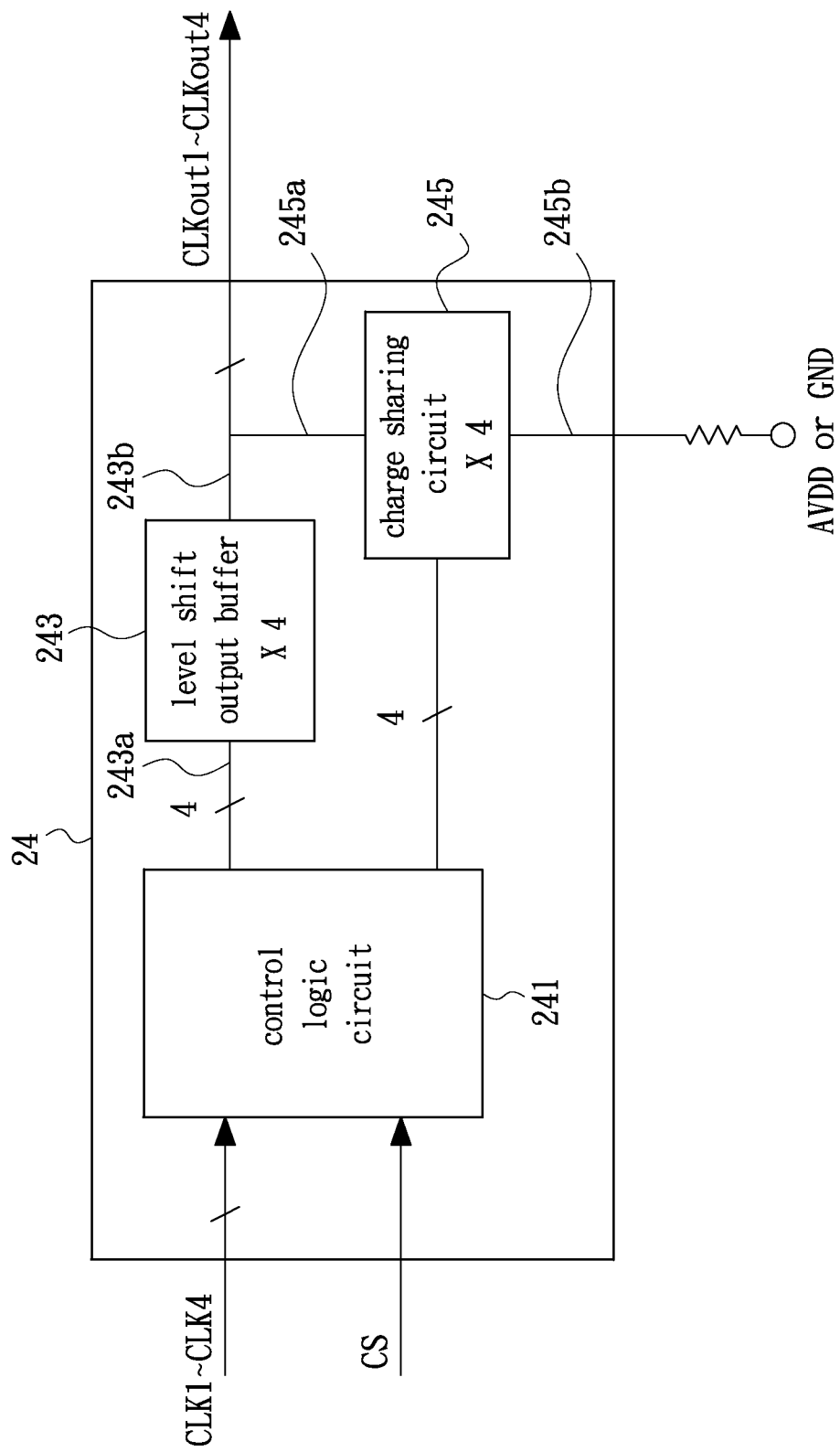
FIG. 3 shows a level shift circuit according to another embodiment of the present invention.

Referring to FIG. 3, a level shift circuit according to another embodiment of the present invention is shown. Basically, the circuit structure of the level shift circuit 24 shown in FIG. 3 and the circuit structure of the level shift circuit 24 shown in FIG. 2 are almost the same, the only difference between the two level shift circuits 24 is that the second terminals 245b of the charge sharing circuits 245 shown in FIG. 3 are coupled to a supply potential (such as AVDD) or a ground potential GND of the liquid crystal display device 10 via a resistor instead of the ground capacitor C1. The supply potential (such as AVDD) and the ground potential GND of the liquid crystal display device 10 are fixed power sources and are served as external power sources.

Figure 4:
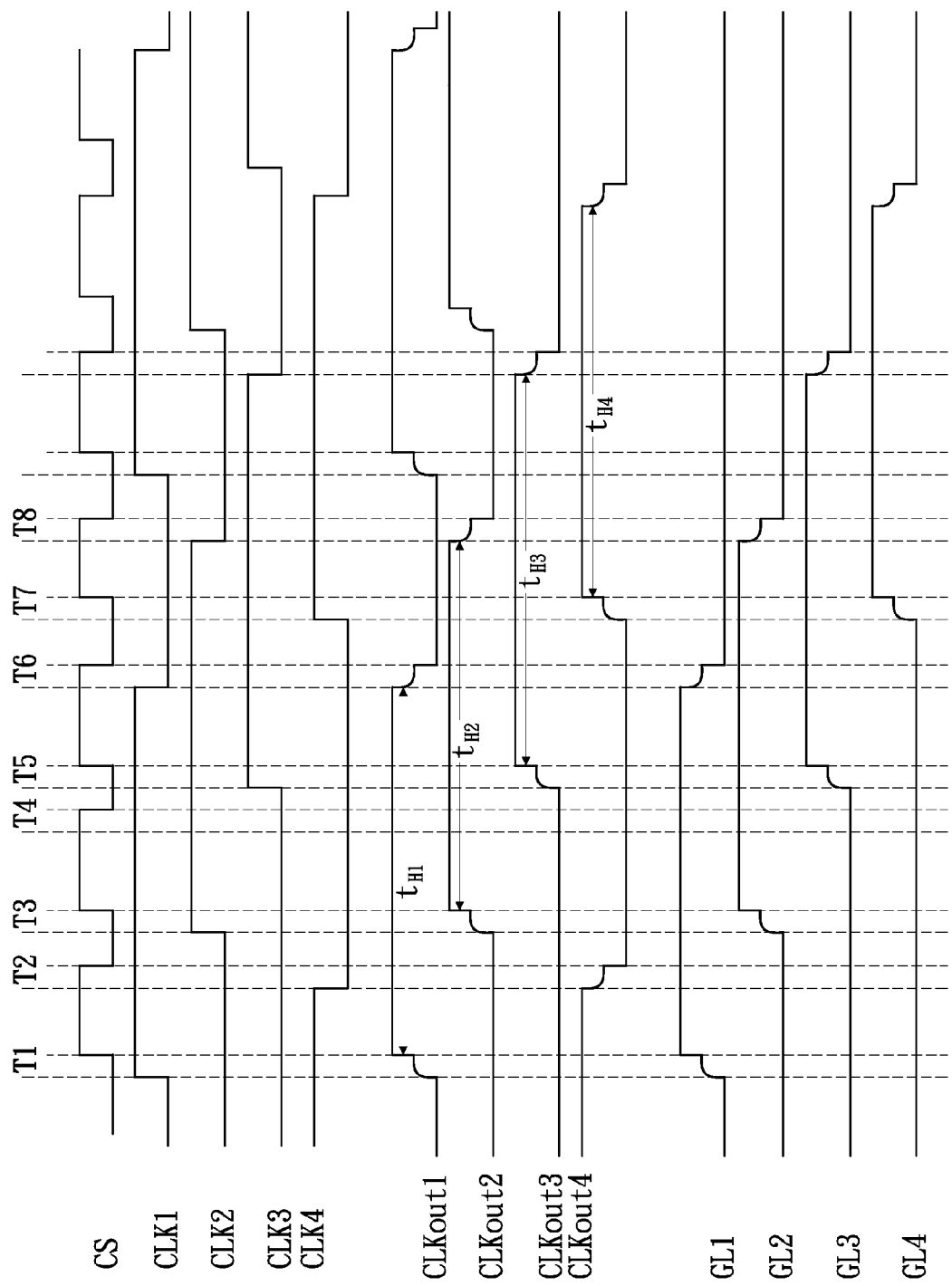
FIG. 4 is a timing diagram illustrating the timing of the input clock pulse signals CLK1~CLK4, the output clock pulse signals $CLK_{out1}$~$CLK_{out4}$ and the gate driving pulses on the gate lines GL1~GL4.

Referring to FIG. 4, a timing diagram illustrating the timing of the input clock pulse signals CLK1~CLK4, the output clock pulse signals $CLK_{out1}$~$CLK_{out4}$ and the gate driving pulses on the gate lines GL1~GL4 is shown. In the following description, the processes that the level shift circuit 24 performs the charge sharing operation on the input clock pulse signals CLK1~CLK4 will be described in detail by using the FIG. 2 and FIG. 3.

As shown in FIG. 4, when the control logic circuit 241 determines that the input clock pulse signal CLK1 changes from the low level to the high level, the control logic circuit 241 turns on the charge sharing circuit 245 corresponding to the input clock pulse signal CLK1 and enables the level shift output buffers 243 to stop outputting signals. Thus, the output clock pulse signal $CLK_{out1}$ on the output terminal 243b of the level shift output buffer 243 corresponding to the input clock pulse signal CLK1 will be electrically coupled to the capacitor C1 to perform the charge sharing operation, and a current will flow from the capacitor C1 to the output terminal 243b of the level shift output buffer 243 corresponding to the input clock pulse signal CLK1. After that, when the control logic circuit 241 determines that the charge sharing signal CS changes from the low level to the high level, the control logic circuit 241 turns off the charge sharing circuit 245 corresponding to the input clock pulse signal CLK1 and enables the level shift output buffer 243 corresponding to the input clock pulse signal CLK1 to start to output a voltage level formed by amplifying the high voltage level of the input clock pulse signal CLK1. Furthermore, the level shift output buffer 243 corresponding to the input clock pulse signal CLK1 will output the amplified input clock pulse signal CLK1 continually till the control logic circuit 241 determines that the input clock pulse signal CLK1 changes from the high level to the low level. In other words, the time period T1 is a performing period of the charge sharing operation regarding the input clock pulse signal CLK1, and the level shift output buffer 243 corresponding to the input clock pulse signal CLK1 do not output any signal in the time period T1.

When the control logic circuit 241 determines that the input clock pulse signal CLK1 changes from the high level to the low level, the control logic circuit 241 turns on the charge sharing circuit 245 corresponding to the input clock pulse signal CLK1 and enables the level shift output buffers 243 to stop outputting signals. Thus, the output clock pulse signal $CLK_{out1}$ on the output terminal 243b of the level shift output buffer 243 corresponding to the input clock pulse signal CLK1 will be electrically coupled to the capacitor C1 to perform the charge sharing operation, and a current will flow from the output terminal 243b of the level shift output buffer 243 corresponding to the input clock pulse signal CLK1 to the capacitor C1. After that, when the control logic circuit 241 determines that the charge sharing signal CS changes from the high level to the low level, the control logic circuit 241 turns off the charge sharing circuit 245 corresponding to the input clock pulse signal CLK1 and enables the level shift output buffer 243 corresponding to the input clock pulse signal CLK1 to start to output another voltage level formed by amplifying the low voltage level of the input clock pulse signal CLK1. Furthermore, the level shift output buffer 243 corresponding to the input clock pulse signal CLK1 will output the amplified input clock pulse signal CLK1 continually till the control logic circuit 241 determines that the input clock pulse signal CLK1 changes from the low level to the high level. In other words, the time period T4 is another performing period of the charge sharing operation regarding the input clock pulse signal CLK1, and the level shift output buffer 243 corresponding to the input clock pulse signal CLK1 do not output any signal in the time period T4.

Briefly, the charge sharing operation regarding the input clock pulse signal CLK1 starts at the time which the input clock pulse signal CLK1 changes from the low voltage level to the high voltage level, and the level shift output buffer 243 corresponding to the input clock pulse signal CLK1 starts to output the high level signal when the charge sharing signal CS changes from the low voltage level to the high voltage level. The charge sharing operation regarding the input clock pulse signal CLK1 also starts at the time which the input clock pulse signal CLK1 changes from the high voltage level to the low voltage level, and the level shift output buffer 243 corresponding to the input clock pulse signal CLK1 starts outputting the low level signal when the charge sharing signal CS changes from the high voltage level to the low voltage level.

In this embodiment, since the processes that the level shift circuit 24 performs the charge sharing operation on the input clock pulse signals CLK1~CLK4 are similar to each other, the processes that the level shift circuit 24 performs the charge sharing operation on the input clock pulse signals CLK2~CLK4 may refer to the process that the level shift circuit 24 performs the charge sharing operation on the input clock pulse signal CLK1, and this will not be further described. From the FIG. 4, it can be seen that the high level period $t_{H1}$ of the output clock pulse signal $CLK_{out1}$ overlaps the high level period $t_{H2}$ of the output clock pulse signal $CLK_{out2}$ and the high level period $t_{H3}$ of the output clock pulse signal $CLK_{out3}$. Similarly, the high level period $t_{H2}$ of the output clock pulse signal $CLK_{out2}$ overlaps the high level period $t_{H3}$ of the output clock pulse signal $CLK_{out3}$ and the high level period $t_{H4}$ of the output clock pulse signal $CLK_{out4}$. The rest may be deduced by analogy and will not be further described. In addition, the gate driving pulse on the gate line GL1 overlaps the gate driving pulse on the gate line GL2 and the gate driving pulse on the gate line GL3. Similarly, the gate driving pulse on the gate line GL2 overlaps the gate driving pulse on the gate line GL3 and the gate driving pulse on the gate line GL4. In other words, during the enabling period of a gate line, a pre-charge operation can be performed on two following gate lines at the same time. Besides, the time periods T2 and T7 are two performing periods of the charge sharing operation regarding the input clock pulse signal CLK4; the time periods T3 and T6 are two performing periods of the charge sharing operation regarding the input clock pulse signal CLK2; and the time periods T5 and T8 are two performing periods of the charge sharing operation regarding the input clock pulse signal CLK3. The time periods T1~T8 relate to the pulse timing and the pulse width of the charge sharing signal CS. For example, if the pulses of the charge sharing signal CS in the FIG. 4 are shifted to the left or to the right (i.e., the pulse timing were changed), the time periods T1~T8 will be shorter or longer correspondingly; if the pulse widths of the pulses of the charge sharing signal CS in the FIG. 4 are increased or decreased, the time periods T1~T8 will also be shorter or longer correspondingly. Therefore, the performing periods of the charge sharing operation of the input clock pulse signal CLK1~CLK4 can be designed flexibly through defining the pulse timing and/or the pulse width of the charge sharing signal CS.

Figure 5:
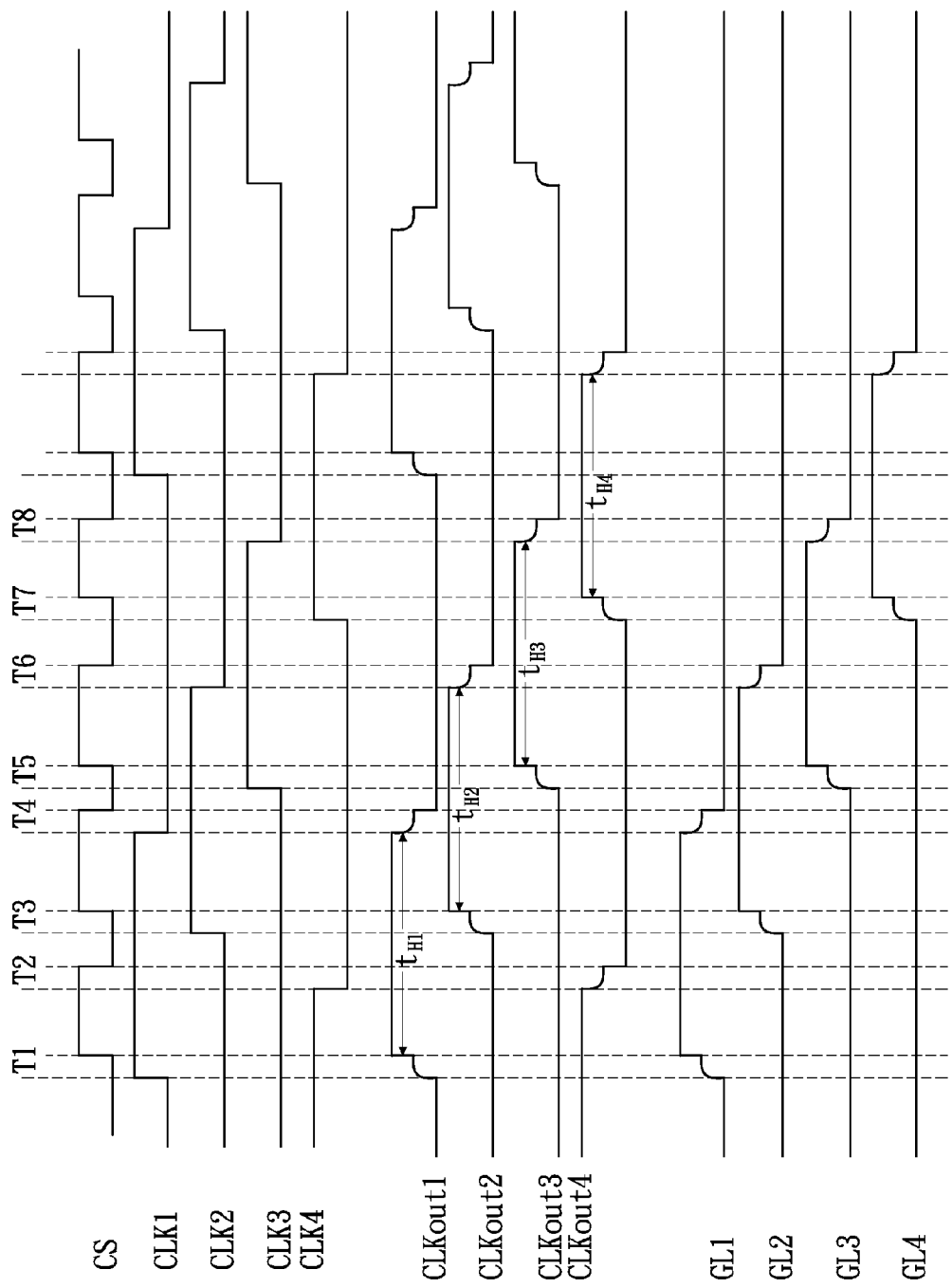
FIG. 5 is another timing diagram illustrating the timing of the input clock pulse signals CLK1~CLK4, the output clock pulse signals $CLK_{out1}$~$CLK_{out4}$ and the gate driving pulses on the gate lines GL1~GL4.

Referring to FIG. 5, another timing diagram illustrating the timing of the input clock pulse signals CLK1~CLK4, the output clock pulse signals $CLK_{out1}$~$CLK_{out4}$ and the gate driving pulses on the gate lines GL1~GL4 is shown. From the FIG. 5, it can be seen that the high level periods $t_{H1}$, $t_{H2}$ and $t_{H3}$ of the output clock pulse signals $CLK_{out1}$~$CLK_{out3}$ overlap the high level periods $t_{H2}$, $t_{H3}$ and $t_{H4}$ of the output clock pulse signals $CLK_{out1}$~$CLK_{out4}$ respectively, and each of the high level periods $t_{H1}$, $t_{H2}$ and $t_{H3}$ just only overlaps the nearest one of the following high level periods. The rest may be deduced by analogy and will not be further described. In addition, the gate driving pulses on the gate lines GL1~GL3 overlap the gate driving pulses on the gate lines GL2~GL4 respectively, and each of the gate driving pulses just only overlaps the nearest one of the following gate driving pulses. The rest may also be deduced by analogy and will not be further described. In other words, during the enabling period of a gate line, a pre-charge operation can be performed on a following gate line at the same time.

Figure 6:
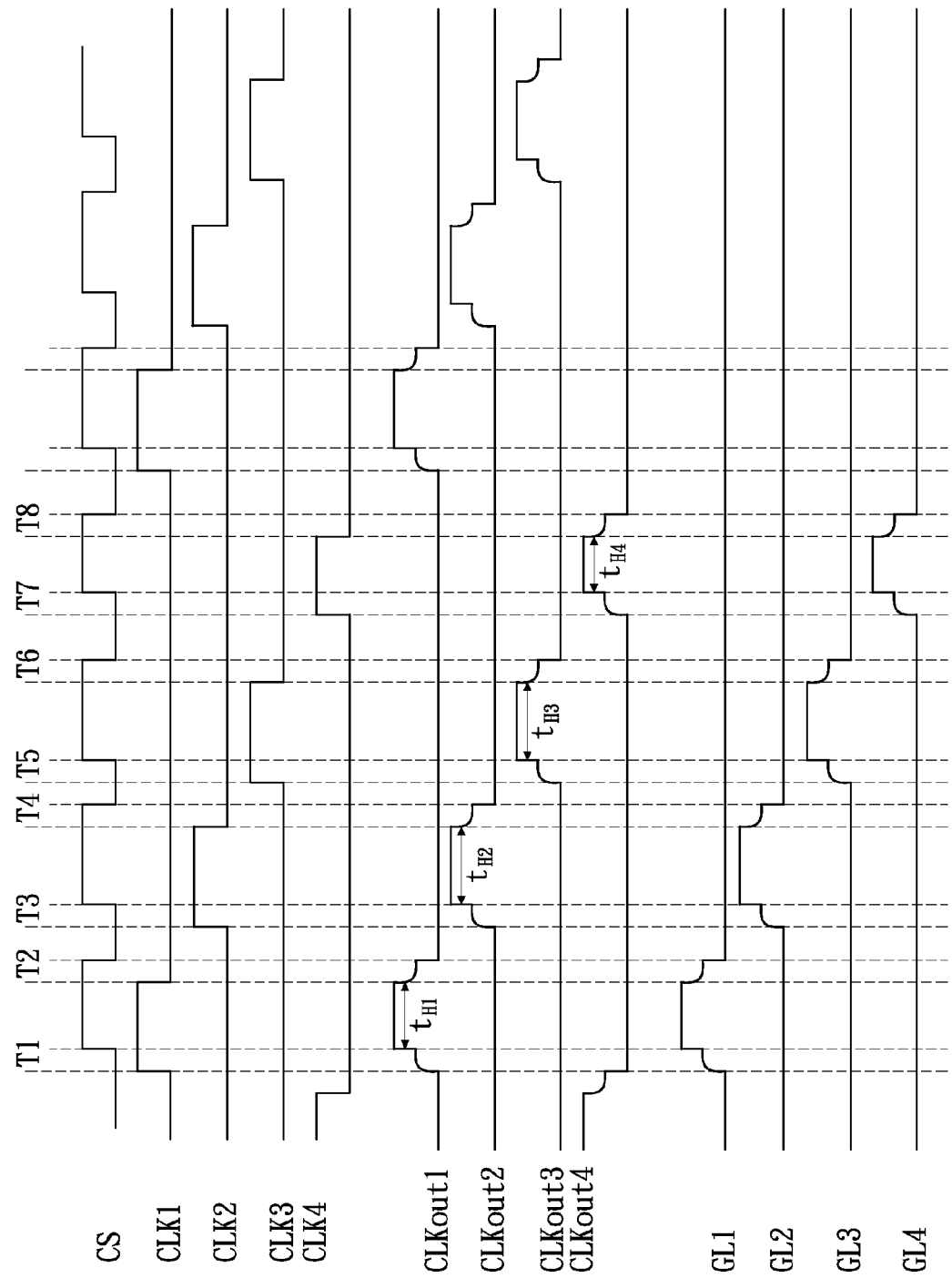
FIG. 6 is another timing diagram illustrating the timing of the input clock pulse signals CLK1~CLK4, the output clock pulse signals $CLK_{out1}$~$CLK_{out4}$ and the gate driving pulses on the gate lines GL1~GL4.

Referring to FIG. 6, another timing diagram illustrating the timing of the input clock pulse signals CLK1~CLK4, the output clock pulse signals $CLK_{out1}$~$CLK_{out4}$ and the gate driving pulses on the gate lines GL1~GL4 is shown. From the FIG. 6, it can be seen that the high level periods $t_{H1}$, $t_{H2}$, $t_{H3}$ and $t_{H4}$ of the output clock pulse signals $CLK_{out1}$~$CLK_{out4}$ do not overlap to each other. In addition, the gate driving pulses on the gate lines GL1~GL4 do not overlap to each other. In other words, during the enabling period of a gate line, no pre-charge operation will be performed on the following gate lines.

To sum up, in the embodiments of the present invention, the level shift circuit is designed according to particular circuit designs, such as adding a control logic circuit and a charge sharing circuit in the level shift circuit, and a voltage level used for performing the charge sharing operation with the input clock pulse signals is provided to the level shift circuit, so that the level shift circuit can process the charge sharing function to reduce the power consumption, and the liquid crystal display adopting the said level shift circuit can save power easily. On the other hand, a charge sharing signal (may be provided by the timing controller) is added to control the charge sharing operation of each input clock pulse signal, this overcomes the drawback that the waveforms of the clock pulse signals of the prior arts can not be designed flexibly. In addition, this enables the charge sharing methods provided by the embodiments of the present invention can be applied to a variety of designs of multi-phase GOA circuits, such as 2 phase, 4 phase or other multi-phase GOA circuits, and the time length of performing the charge sharing can be designed according to a variety of real requirements.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A level shift circuit, suitable for receiving a plurality of input clock pulse signals and a charge sharing signal and for performing a charge sharing operation on each of the input clock pulse signals to generate a plurality of output clock pulse signals, the level shift circuit comprising:
a control logic circuit, configured for receiving the input clock pulse signals and the charge sharing signal and for acquiring voltage level information of each of the input clock pulse signals and voltage level information of the charge sharing signal;
a plurality of level shift output buffers, each of the level shift output buffers having an input terminal and an output terminal, the input terminals of the level shift output buffers being electrically coupled to the control logic circuit, each of the level shift output buffers being configured for amplifying a corresponding one of the input clock pulse signals and determining whether to output the output clock pulse signal according to the voltage level information of the charge sharing signal acquired by the control logic circuit; and
a plurality of charge sharing circuits, each of the charge sharing circuits being electrically coupled between a predetermined voltage level and the output terminal of a corresponding one of the level shift output buffers, each of the charge sharing circuits determining whether to be turned on according to the voltage level information of a corresponding one of the input clock pulse signals and the charge sharing signal acquired by the control logic circuit, when one of the charge sharing circuits is turned on, the predetermined voltage level and the output terminal of a corresponding one of the level shift output buffers are electrically coupled to each other only, so as to perform the charge sharing operation.

2. The level shift circuit as claimed in claim 1, wherein each of the charge sharing circuits comprises a first terminal and a second terminal, each of the first terminals of the charge sharing circuits is electrically coupled to the output terminal of a corresponding one of the level shift output buffers, the second terminals of the charge sharing circuits are electrically coupled to a capacitor, and the predetermined voltage level is the voltage across the capacitor.

3. The level shift circuit as claimed in claim 1, wherein the level shift circuit is suitable for a liquid crystal display device having a multi-phase gate-on-array shift register.

4. The level shift circuit as claimed in claim 3, wherein the predetermined voltage level is a ground potential or a supply potential of the liquid crystal display device.

5. A liquid crystal display device, comprising:
a timing controller, configured for generating a plurality of first clock pulse signals and a charge sharing signal;
a level shift circuit, configured for receiving the first clock pulse signals and the charge sharing signal and for performing a charge sharing operation on each of the first clock pulse signals to generate a plurality of second clock pulse signals corresponding to the first clock pulse signals; and
a multi-phase gate-on-array shift register, configured for receiving the second clock pulse signals and for generating a plurality of gate driving pulses according to the second clock pulse signals to enable a plurality of gate lines of the liquid crystal display device;
wherein the level shift circuit comprises:
a control logic circuit, configured for receiving the first clock pulse signals and the charge sharing signal and for acquiring voltage level information of each of the first clock pulse signals and voltage level information of the charge sharing signal;
a plurality of level shift output buffers, electrically coupled to the control logic circuit, each of the level shift output buffers being configured for amplifying a corresponding one of the first clock pulse signals and determining whether to output the output clock pulse signal according to the voltage level information of the charge sharing signal acquired by the control logic circuit; and
a plurality of charge sharing circuit, each of the charge sharing circuits being electrically coupled between a predetermined voltage level and the output terminal of a corresponding one of the level shift output buffers, each of the charge sharing circuits determining whether to be turned on according to the voltage level information of a corresponding one of the first clock pulse signals and the charge sharing signal acquired by the control logic circuit, when one of the charge sharing circuits is turned on, the predetermined voltage level and the output terminal of a corresponding one of the level shift output buffers are electrically coupled to each other only, so as to perform the charge sharing operation.

6. The liquid crystal display device as claimed in claim 5, wherein each of the charge sharing circuits comprises a first terminal and a second terminal, each of the first terminals of the charge sharing circuits is electrically coupled to the output terminal of a corresponding one of the level shift output buffers, the second terminals of the charge sharing circuits are electrically coupled to a capacitor, and the predetermined voltage level is the voltage across the capacitor.

7. The liquid crystal display device as claimed in claim 5, wherein the predetermined voltage level is a ground potential or a supply potential of the liquid crystal display device.

8. A charge sharing method, comprising:
providing a plurality of input clock pulse signals and a charge sharing signal; and
turning on an external power source and the input clock pulse signals only, if the input clock pulse signals changes into a second voltage level from a first voltage level, and the charge sharing signal changes into a third voltage level from a fourth voltage level for performing a charge sharing operation, so as to generate a plurality of output clock pulse signals corresponding to the input clock pulse signals.

9. The charge sharing method as claimed in claim 8, wherein the charge sharing method is suitable for being executed in a level shift circuit, and performing the charge sharing operation on each of the input clock pulse signals according to voltage level information of the input clock pulse signals and voltage level information of the charge sharing signal comprises:
performing a first charge sharing operation when input clock pulse signal changes form the first voltage level to the second voltage level;
stopping performing the first charge sharing operation when the charge sharing signal changes from the third voltage level to the fourth voltage level, and determining the level shift circuit to start outputting a voltage level formed by amplifying the second voltage level by the level shift circuit;
determining the level shift circuit to stop outputting the voltage level formed by amplifying the second voltage level by the level shift circuit when the input clock pulse signal changes from the second voltage level to the first voltage level, and performing a second charge sharing operation at the same time; and stopping performing the second charge sharing operation when the charge sharing signal charges from the fourth voltage level to the third voltage level, and determining the level shift circuit to start to output another voltage level formed by amplifying the first voltage level by the level shift circuit.

10. The charge sharing method as claimed in claim 9, wherein the first voltage level is lower than the second voltage level, and the third voltage level is lower than the fourth voltage level.

11. The charge sharing method as claimed in claim 9, wherein the time lengths of performing the first charge sharing operation and the second charge sharing operation are designed according to the pulse timing and/or the pulse width of the charge sharing signal.

12. The charge sharing method as claimed in claim 9, wherein the time periods of the clock pulse signals situating in a high level do not overlap.

13. The charge sharing method as claimed in claim 9, wherein at least some of the time periods of the clock pulse signals situating in a high level overlap.

14. The charge sharing method as claimed in claim 9, further comprising:
providing a capacitor to sever as the external power source.

15. The charge sharing method as claimed in claim 9, further comprising:
providing a fixed power source to sever as the external power source.

16. A charge sharing method, comprising:
providing a plurality of input clock pulse signals to generate a plurality of output clock pulse signals respectively, and a charge sharing signal; and
turning on a predetermined voltage level to at least one of the output clock pulse signals only, if a charging sharing operation is performing for the corresponding input clock pulse signal;
wherein in performing the charge sharing operation on each of the input clock pulse signals, a first time period starting from the time where the input clock pulse signal changes from a first voltage level to a second voltage level to the time where the nearest charge sharing signal changes from a third voltage level to a fourth voltage level and a second time period starting from the time where the input clock pulse signal changes from the second voltage level to the first voltage level to the time where the nearest charge sharing signal changes from the fourth voltage level to the third voltage level are both the performing periods of the charge sharing operation.

17. The charge sharing method as claimed in claim 16, wherein the first voltage level is lower than the second voltage level, and the third voltage level is lower than the fourth voltage level.

18. The charge sharing method as claimed in claim 16, wherein the lengths of the first time period and the second time period are designed according to the pulse timing and/or the pulse width of the charge sharing signal.

19. The charge sharing method as claimed in claim 16, wherein the time periods of the output clock pulse signals situating in a high level do not overlap.

20. The charge sharing method as claimed in claim 16, wherein at least some of the time periods of the output clock pulse signals situate in a high level overlap.

* * * * *